(12) United States Patent
Chi

(10) Patent No.: US 11,594,264 B1
(45) Date of Patent: Feb. 28, 2023

(54) READOUT CIRCUIT LAYOUT STRUCTURE AND METHOD OF READING DATA

(71) Applicant: CHANGXIN MEMORY TECHNOLOGIES, INC., Hefei (CN)

(72) Inventor: Sungsoo Chi, Hefei (CN)

(73) Assignee: GHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/813,998

(22) Filed: Jul. 21, 2022

Related U.S. Application Data

(63) Continuation of application No. PCT/CN2022/088090, filed on Apr. 21, 2022.

(30) Foreign Application Priority Data

Nov. 15, 2021 (CN) .......................... 202111347655.2

(51) Int. Cl.
  *G11C 7/18* (2006.01)
  *G11C 7/06* (2006.01)
  (Continued)

(52) U.S. Cl.
  CPC .............. *G11C 7/06* (2013.01); *G11C 7/1048* (2013.01); *G11C 7/12* (2013.01); *G11C 2207/002* (2013.01)

(58) Field of Classification Search
  CPC ........... G11C 7/06; G11C 7/1048; G11C 7/12; G11C 2207/002
  (Continued)

(56) References Cited

U.S. PATENT DOCUMENTS

| 5,300,839 A * | 4/1994 | Kawahara | .............. G11C 7/065 365/208 |
| 6,819,600 B2 * | 11/2004 | Sim | ........................ G11C 7/065 365/207 |

(Continued)

FOREIGN PATENT DOCUMENTS

| CN | 101241749 A | 8/2008 |
| CN | 108257631 A | 7/2018 |
| CN | 111739566 A | 10/2020 |

OTHER PUBLICATIONS

International Search Report PCT/CN2022/088090 dated Aug. 3, 2022, 17 pages.

*Primary Examiner* — Tha-O H Bui
(74) *Attorney, Agent, or Firm* — Cooper Legal Group, LLC

(57) ABSTRACT

The present disclosure relates to the field of semiconductor circuit design, and in particular to a readout circuit layout structure and a method of reading data. The readout circuit layout structure includes: a first readout circuit structure and a second readout circuit structure having identical structures, wherein the first readout circuit structure and the second readout circuit structure each include: a first isolation module, configured to be turned on according to a first isolation signal, electrically connect a bit line and a first readout bit line, and electrically connect a complementary bit line and a first complementary readout bit line; a second isolation module, configured to be turned on according to a second isolation signal, electrically connect the first readout bit line and a second readout bit line, and electrically connect the first complementary readout bit line and a second complementary readout bit line.

18 Claims, 9 Drawing Sheets

(51) Int. Cl.
  *G11C 7/10* (2006.01)
  *G11C 7/12* (2006.01)
(58) Field of Classification Search
  USPC .......................................................... 365/203
  See application file for complete search history.

(56) References Cited

U.S. PATENT DOCUMENTS

| | | | | |
|---|---|---|---|---|
| 7,570,529 | B2* | 8/2009 | Kim | G11C 11/4091 |
| | | | | 365/189.11 |
| 9,202,531 | B2* | 12/2015 | Seo | G11C 7/065 |
| 10,224,093 | B2* | 3/2019 | Kim | G11C 11/4091 |
| 10,535,388 | B1* | 1/2020 | Ingalls | G11C 7/065 |
| 10,902,889 | B2* | 1/2021 | Oak | G11C 7/08 |
| 11,024,365 | B1* | 6/2021 | Seo | G11C 11/4091 |
| 2018/0061461 | A1* | 3/2018 | Seo | G11C 7/12 |

* cited by examiner

READOUT CIRCUIT LAYOUT STRUCTURE AND METHOD OF READING DATA

CROSS-REFERENCE TO RELATED APPLICATIONS

This is a continuation of International Application No. PCT/CN2022/088090, filed on Apr. 21, 2022, which claims the priority to Chinese Patent Application 202111347655.2, titled "READOUT CIRCUIT LAYOUT STRUCTURE AND METHOD OF READING DATA" and filed on Nov. 15, 2021. The entire contents of International Application No. PCT/CN2022/088090 and Chinese Patent Application 202111347655.2 are incorporated herein by reference.

TECHNICAL FIELD

Embodiments of the present disclosure relate to, but are not limited to, a readout circuit layout structure and a method of reading data.

BACKGROUND

As a commonly used semiconductor memory in computers, a dynamic random access memory (DRAM) is composed of many repeated memory cells. Each memory cell typically includes a capacitor and a transistor. In the transistor, the gate is connected to a word line, the drain is connected to a bit line, and the source is connected to the capacitor. The voltage signal on the word line controls the transistor to turn on or off, and then the data information stored in the capacitor is read through the bit line, or data information is written into the capacitor through the bit line for storage.

DRAMs can be classified into double data rate (DDR) DRAMs, graphics double data rate (GDDR) DRAMs, and low power double data rate (LPDDR) DRAMs. As DRAMs are applied to more and more fields, for example, DRAMs are increasingly used in mobile field, users have increasingly higher requirements on the power consumption indicator of the DRAMs.

However, the current DRAM performance still needs to be improved.

SUMMARY

An overview of the subject matter detailed in the present disclosure is provided below, which is not intended to limit the protection scope of the claims.

An embodiment of the present disclosure provides a readout circuit layout structure, including: a first readout circuit structure and a second readout circuit structure having identical structures, wherein the first readout circuit structure and the second readout circuit structure each include: a first isolation module, configured to be turned on according to a first isolation signal, electrically connect a bit line and a first readout bit line, and electrically connect a complementary bit line and a first complementary readout bit line; a second isolation module, configured to be turned on according to a second isolation signal, electrically connect the first readout bit line and a second readout bit line, and electrically connect the first complementary readout bit line and a second complementary readout bit line; a sense amplification module, configured to sense and read a data signal of a memory array when the first isolation module and the second isolation module are turned on; and an offset cancellation module, configured to electrically connect the first complementary readout bit line and the second readout bit line according to an offset canceling signal. The first readout circuit structure is coupled to first adjacent memory arrays through a first bit line and a first complementary bit line; the second readout circuit structure is coupled to second adjacent memory arrays through a second bit line and a second complementary bit line; the second isolation module, the sense amplification module, and the offset cancellation module in the first readout circuit structure are arranged in a first region; in a bit line extension direction, the first isolation module in the first readout circuit structure is arranged at two sides of the first region; the second isolation module, the sense amplification module, and the offset cancellation module in the second readout circuit structure are arranged in a second region; in the bit line extension direction, the first isolation module in the second readout circuit structure is arranged at two sides of the second region. The first region and the second region are adjacent to each other in the bit line extension direction.

An embodiment of the present disclosure further provides a method of reading data, applied to the foregoing readout circuit layout structure and including three readout phases. The method of reading data includes: in a first readout phase, providing an equalizing signal, a first isolation signal, and an offset canceling signal, and precharging a bit line, a first readout bit line, a second readout bit line, a complementary bit line, a first complementary readout bit line, and a second complementary readout bit line to a preset voltage; at a beginning of a second readout phase, holding the offset canceling signal for a preset duration, performing an offset cancellation on a sense amplification module through a first voltage and a second voltage applied to two ends of the sense amplification module, turning on a word line of a memory array at the same time, and performing a charge sharing based on a potential of the bit line and a potential of a memory cell in the memory array; in an execution process of the second readout phase, providing the first isolation signal and a second isolation signal, transmitting storage data from the bit line to the first readout bit line, maintaining the complementary bit line at the preset voltage, and performing a charge sharing on a potential of the first readout bit line and a potential of the second readout bit line; and in a third readout phase, holding the first isolation signal and the second isolation signal, through the first voltage and the second voltage applied to the two ends of the sense amplification module, performing a sense amplification on the storage data by the sense amplification module according to the potential of the second readout bit line and a potential of the second complementary readout bit line, reading the storage data, and restoring the storage data in the memory cell.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the FIG. 1 is a schematic structural diagram of a readout circuit according to an embodiment of the present disclosure.

REFERENCE NUMERALS

Figure 1:
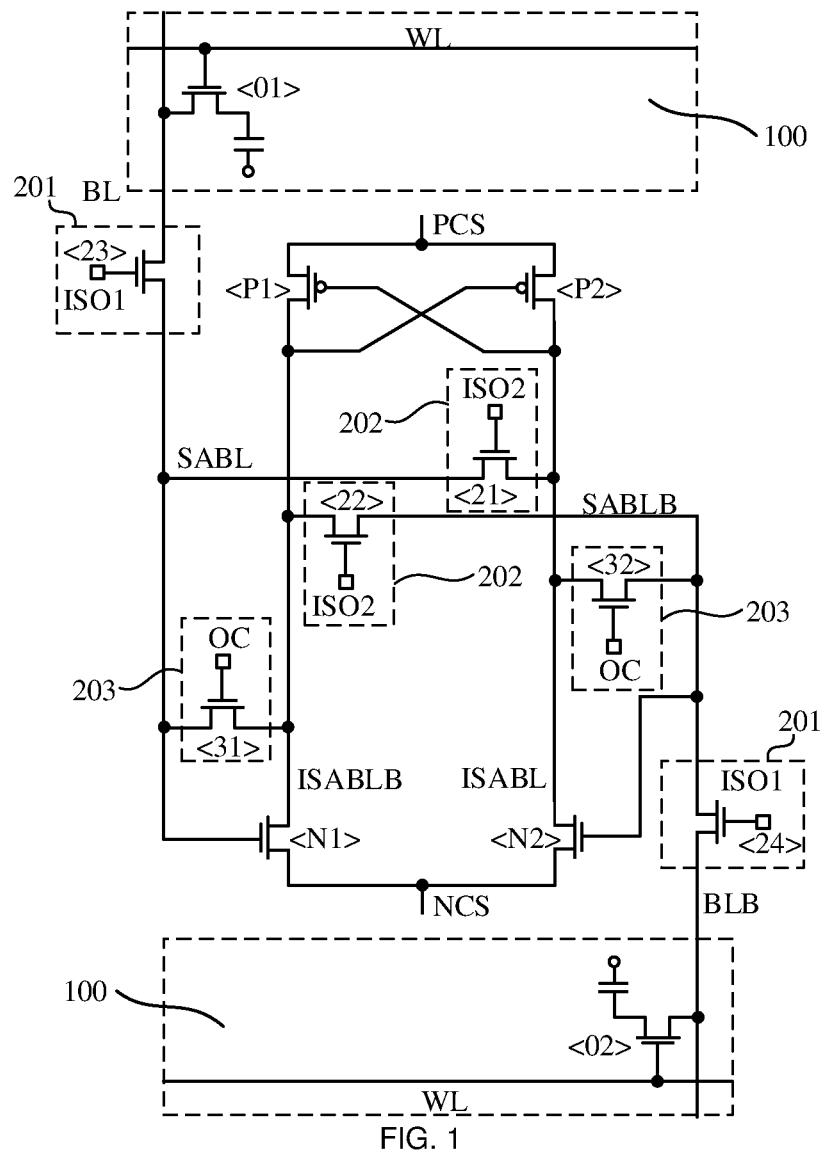

100: memory array; 201: first isolation module; 202: second isolation module; 203: offset cancellation module; 310: equalizing module; 320: precharge module; 301: first readout circuit structure; 302: second readout circuit structure; 401: first precharge module; 402: second precharge module;

<11>: equalizing metal oxide semiconductor (MOS) transistor; <12>: precharge MOS transistor; <21>: first isolation MOS transistor; <22>: second isolation MOS transistor; <23>: third isolation MOS transistor; <24>: fourth isolation MOS transistor; <31>: first offset cancellation MOS transistor; <32>: second offset cancellation MOS transistor; <N1>: first sense amplification N-type transistor; <N2>: second sense amplification N-type transistor; <P1>: first sense amplification P-type transistor; <P2>: second sense amplification P-type transistor; <41>: first precharge MOS transistor; <42>: second precharge MOS transistor;

BL: bit line; BL1: first bit line; BL2: second bit line; BLB: complementary bit line; BLB1: first complementary bit line; BLB2: second complementary bit line; SABL: first readout bit line; ISABL: second readout bit line; SABLB: first complementary readout bit line; ISABLB: second complementary readout bit line; ISO1: first isolation signal; ISO2: second isolation signal; OC: offset canceling signal; PCS: first signal terminal; NCS: second signal terminal;

<N1402>: first isolation MOS transistor; <N1403>: second isolation MOS transistor; <N1408>: third isolation MOS transistor; <N1428>: fourth isolation MOS transistor; <N1406>: precharge MOS transistor; <N1400>: first sense amplification N-type transistor; <N1401>: first offset cancellation MOS transistor; <N1404>: second offset cancellation MOS transistor; <P1401>: first sense amplification P-type transistor; <P1400>: second sense amplification P-type transistor;

<N1422>: first isolation MOS transistor; <N1423>: second isolation MOS transistor; <N1409>: third isolation MOS transistor; <N1429>: fourth isolation MOS transistor; <N1427>: precharge MOS transistor; <N1420>: first sense amplification N-type transistor; <N1421>: first offset cancellation MOS transistor; <N1424>: second offset cancellation MOS transistor; <P1421>: first sense amplification P-type transistor; <P1420>: second sense amplification P-type transistor.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The improved performance of a DRAM requires a higher signal processing speed of an internal circuit of the DRAM.

In a storage data readout process of an existing sense amplification module with an offset compensation function, a certain period of time is needed to execute an offset cancellation process, and then the storage data is transmitted to the sense amplification module. As a result, it takes a longer time for the sense amplification module to process read data, and the power consumption increases, thus failing to further increase the data processing speed.

An embodiment of the present disclosure provides a readout circuit layout structure. When the sense amplification module executes an offset cancellation process, data in a memory cell is transmitted in advance to a bit line connected to the sense amplification module, which reduces the overall time of the sense amplification module for processing the storage data while ensuring that there is sufficient time for potential amplification of the sense amplification module, thereby improving the speed and accuracy of memory data readout. Moreover, first and second readout circuit structures are arranged adjacent to each other, and various parts are distributed orderly, thereby ensuring a minimized area occupied by the readout circuit structures and shortest connections among various devices.

Those of ordinary skill in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 2:
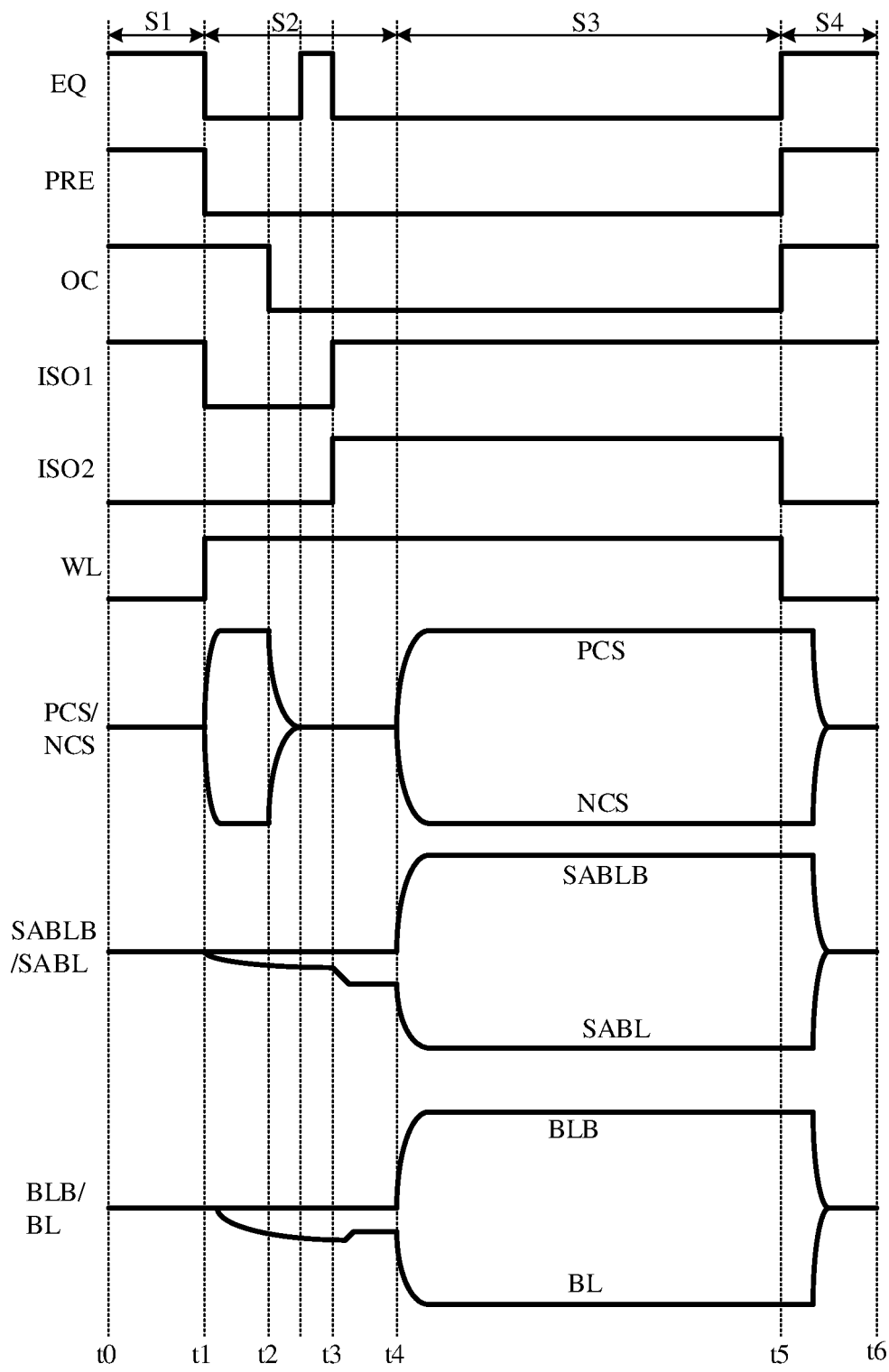
FIG. 2 is a schematic diagram of readout timing of a readout circuit according to an embodiment of the present disclosure.
Figure 3:
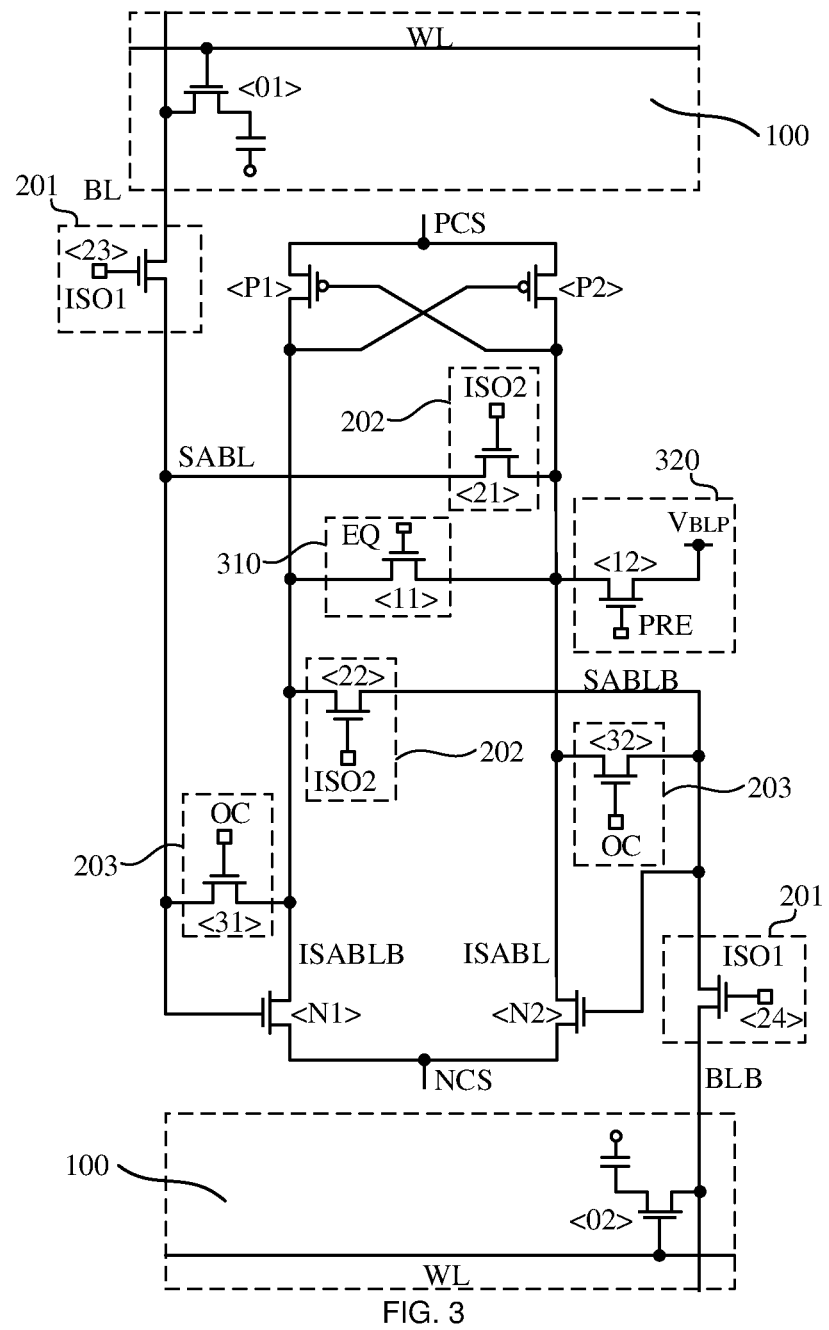
FIG. 3 and FIG. 4 are schematic structural diagrams of a readout circuit having a precharge function according to an embodiment of the present disclosure.
Figure 4:
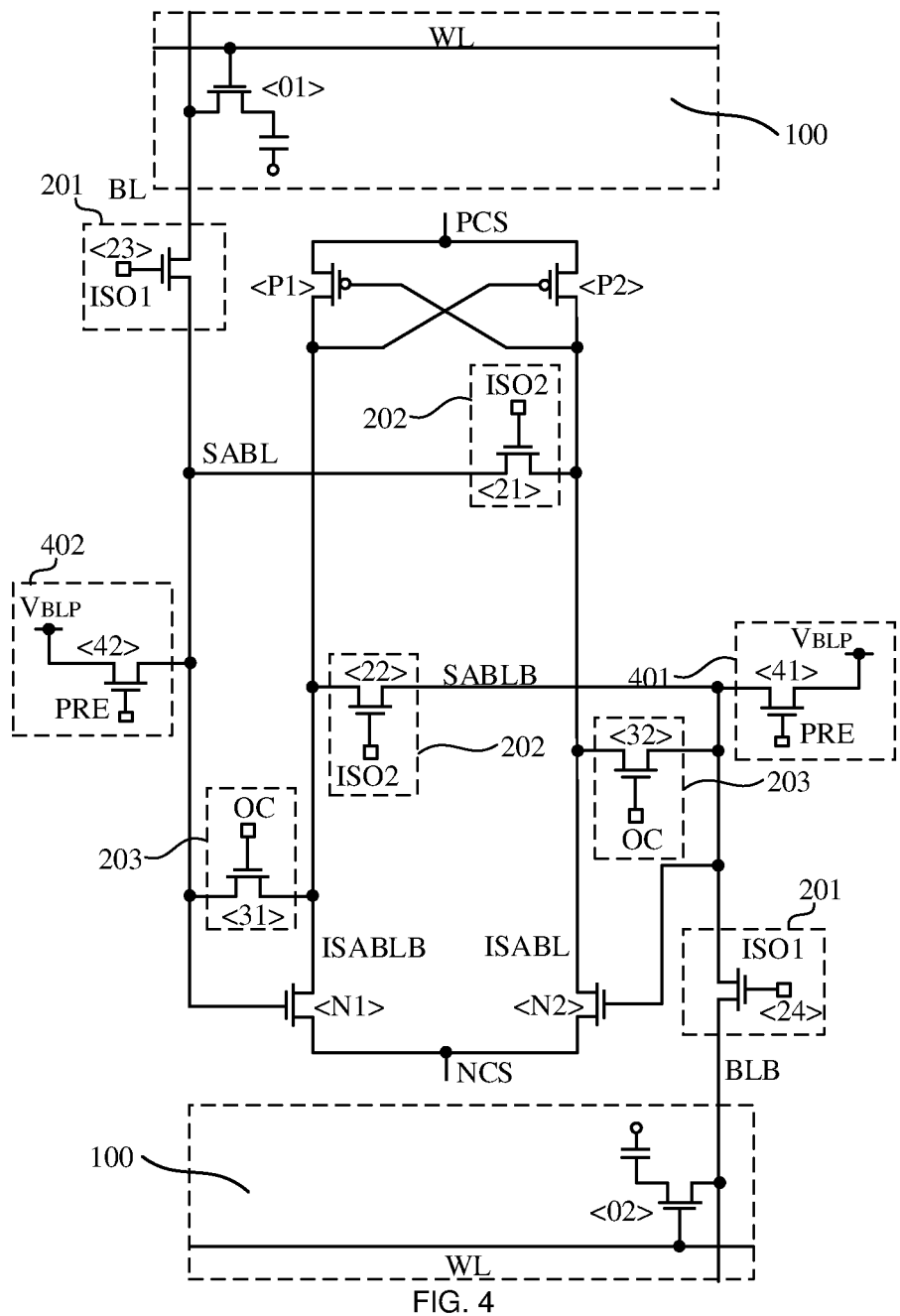
Figure 5:
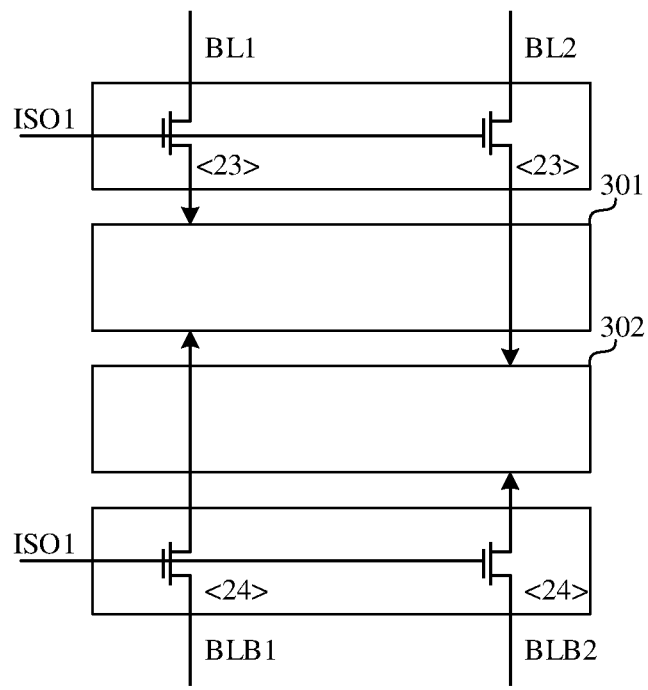
FIG. 5 is a schematic structural diagram of a readout circuit layout according to an embodiment of the present disclosure.
Figure 6:
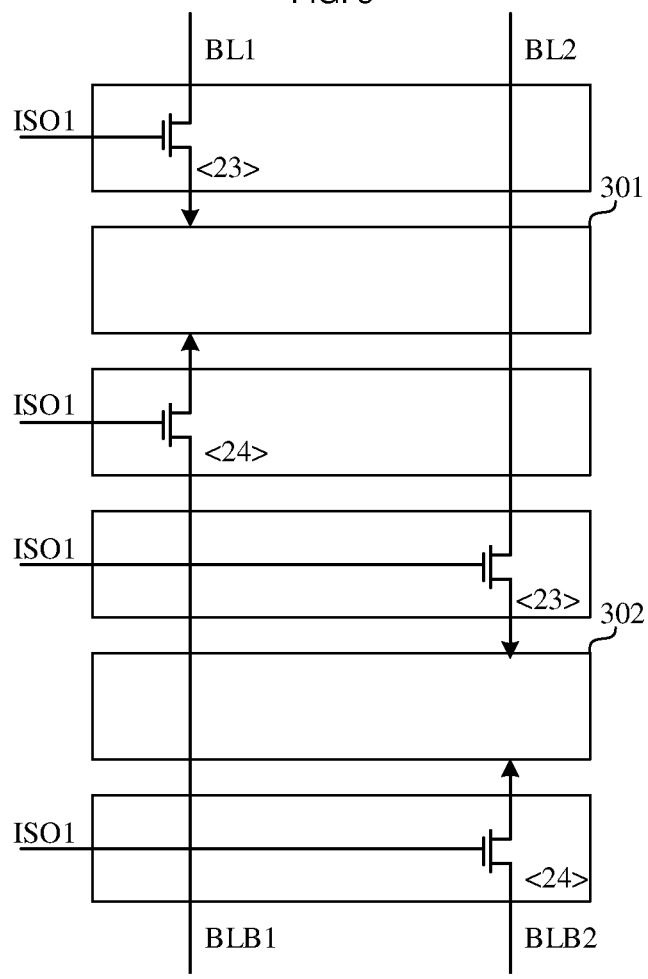
FIG. 6 to FIG. 7 are specific schematic structural diagrams of a readout circuit layout according to an embodiment of the present disclosure.
Figure 7:
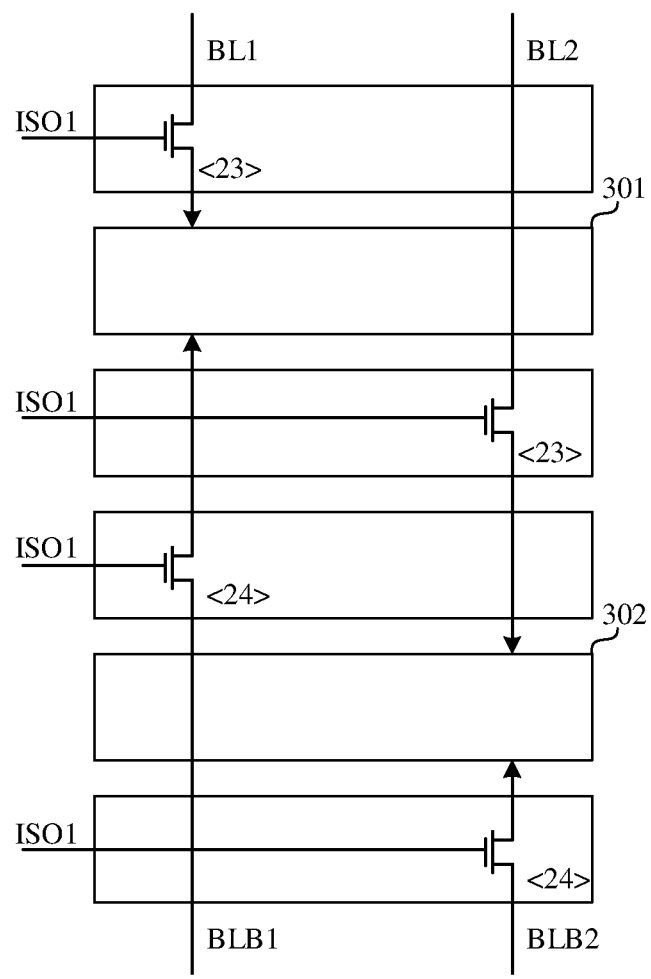
Figure 8:
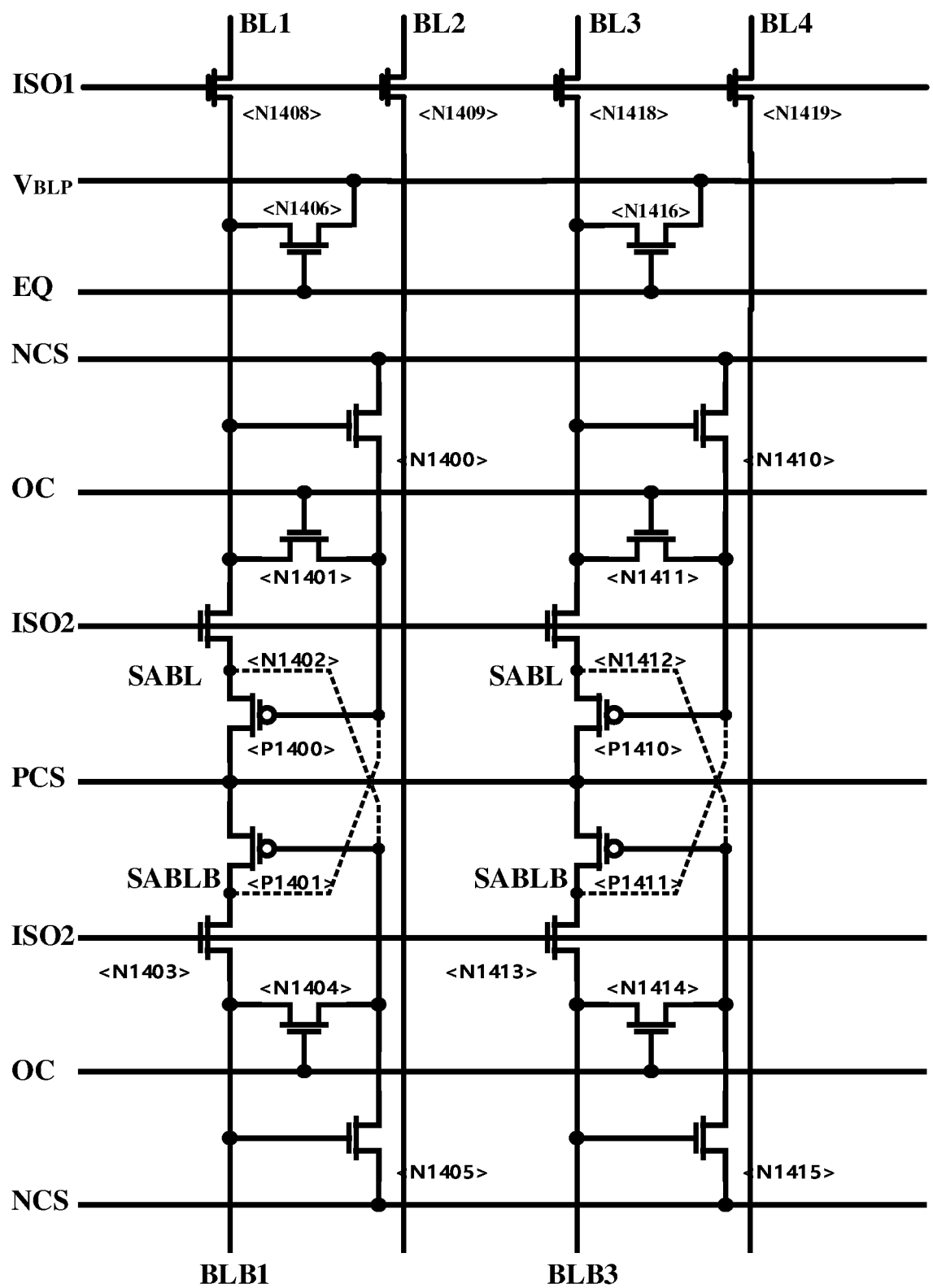
FIG. 8 is a schematic structural diagram of a first readout circuit structure according to an embodiment of the present disclosure.
Figure 9:
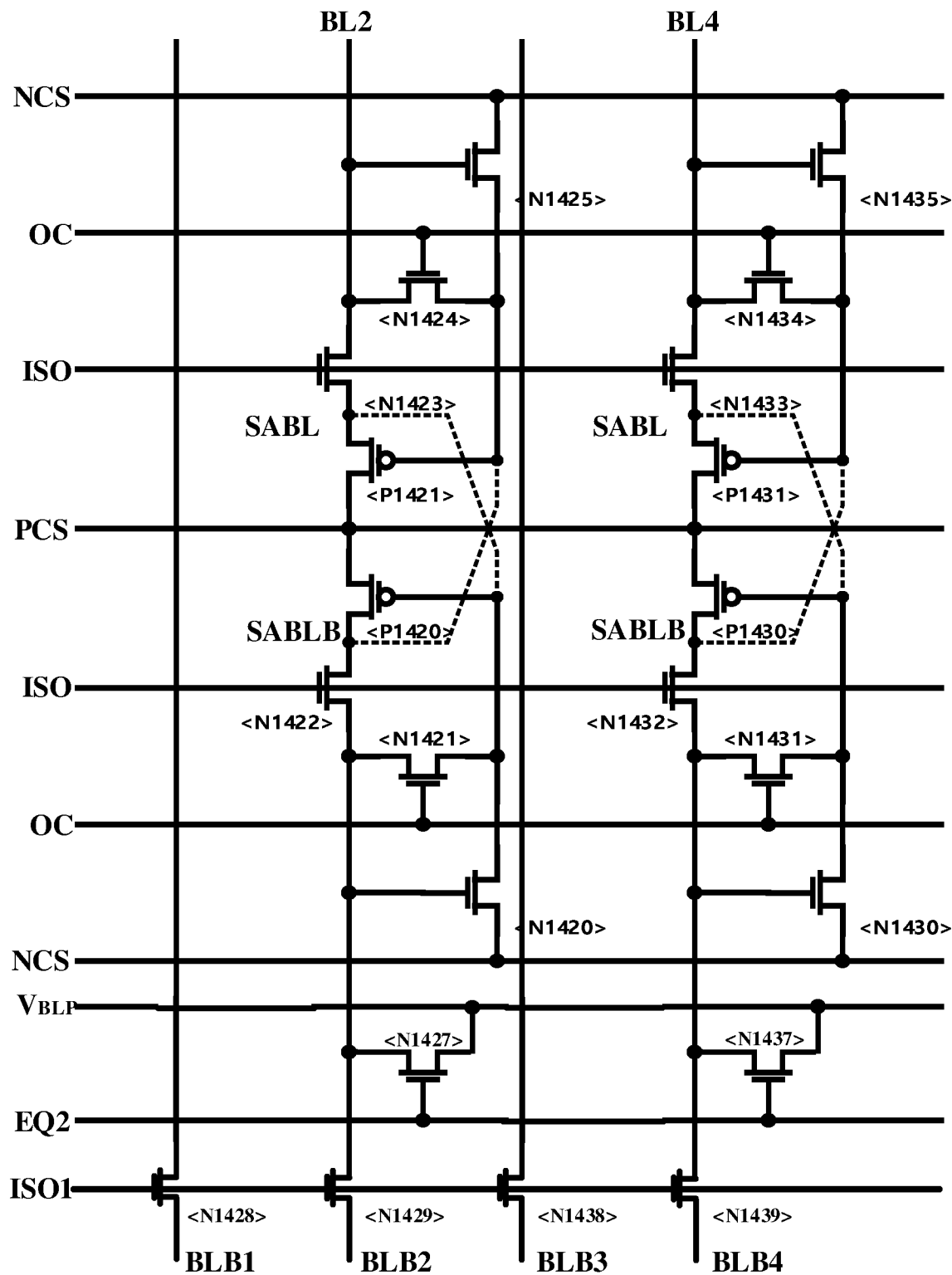
FIG. 9 is a schematic structural diagram of a second readout circuit structure according to an embodiment of the present disclosure.
Figure 10:
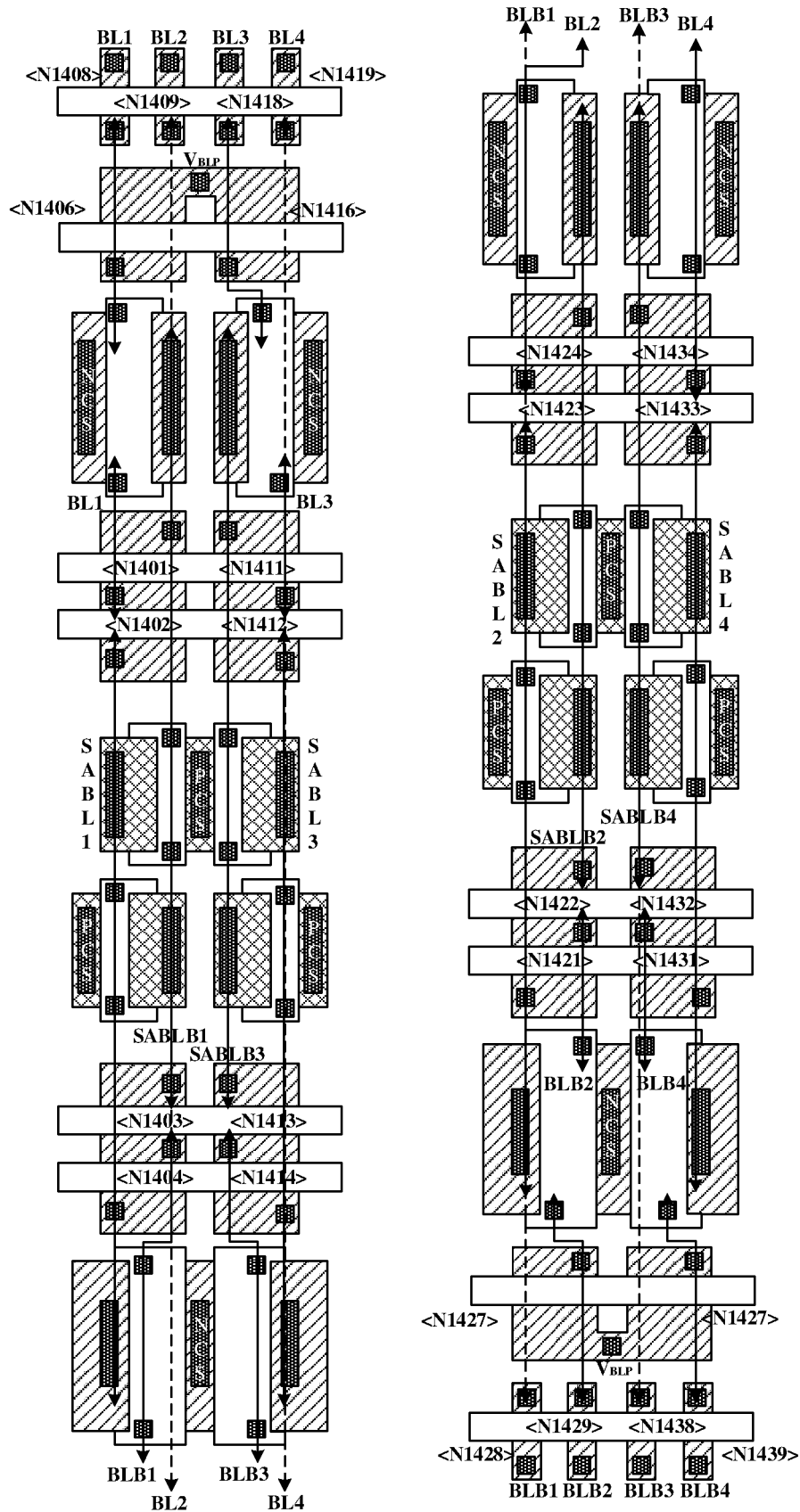
FIG. 10 is a specific readout circuit layout corresponding to FIG. 8 and FIG. 9 according to an embodiment of the present disclosure.

FIG. 1 is a schematic structural diagram of a readout circuit according to this embodiment; FIG. 2 is a schematic diagram of readout timing of a readout circuit according to this embodiment; FIG. 3 and FIG. 4 are schematic structural diagrams of a readout circuit having a precharge function according to this embodiment; FIG. 5 is a schematic structural diagram of a readout circuit layout according to this embodiment; FIG. 6 to FIG. 7 are specific schematic structural diagrams of a readout circuit layout according to this embodiment; FIG. 8 is a schematic structural diagram of a first readout circuit structure according to this embodiment; FIG. 9 is a schematic structural diagram of a second readout circuit structure according to this embodiment; and FIG. 10 is a specific readout circuit layout corresponding to FIG. 8 and FIG. 9 according to this embodiment. The readout circuit layout structure provided by this embodiment is described in further detail below with reference to the accompanying drawings.

Referring to FIG. 1, a readout circuit is arranged between adjacent memory arrays 100, and is connected to a memory array 100 through a bit line BL and connected to the other memory array 100 through a complementary bit line BLB. The readout circuit includes a first isolation module 201, a second isolation module 202, a sense amplification module, and an offset cancellation module 203.

The first isolation module 201 is arranged between the bit line BL and a first readout bit line SABL and configured to electrically connect the bit line BL and the first readout bit line SABL according to a first isolation signal ISO1, and is further arranged between the complementary bit line BLB and a first complementary readout bit line SABLB and configured to be turned on according to the first isolation signal ISO1, electrically connect the complementary bit line BLB and the first complementary readout bit line SABLB.

The second isolation module 202 is connected between the first readout bit line SABL and the second readout bit line ISABL and configured to be turned on according to a second isolation signal ISO2, electrically connect the first readout bit line SABL and the second readout bit line ISABL, and is further connected between the first complementary readout bit line SABLB and a second complementary readout bit line ISABLB and configured to be turned on according to the second isolation signal ISO2, electrically connect the first complementary readout bit line SABLB and the second complementary readout bit line ISABLB.

The sense amplification module is connected to the first readout bit line SABL and the first complementary readout bit line SABLB and further connected to the second readout bit line ISABL and the second complementary readout bit line ISABLB, and is configured to sense and read a data signal of the memory array 100 when the first isolation module 201 and the second isolation module 202 are turned on.

The offset cancellation module 203 is connected between the first readout bit line SABL and the second complementary readout bit line ISABLB and configured to electrically connect the first readout bit line SABL and the second complementary readout bit line ISABLB according to an offset canceling signal OC, and is further connected between the first complementary readout bit line SABLB and the second readout bit line ISABL and configured to electrically connect the first complementary readout bit line SABLB and the second readout bit line ISABL according to the offset canceling signal.

The first isolation module 201 isolates the bit line BL from the first readout bit line SABL, and blocks the complementary bit line BLB and the first complementary readout bit line SABLB, which prevents potential changes of the bit line BL and the complementary bit line BLB from affecting the sense amplification module, thereby turning on the word line WL in advance without affecting the sense amplification module. By turning on the word line WL in advance, the potential on the memory cell 100 is synchronized to an initial bit line BL or initial complementary bit line BLB, so that there is sufficient time for potential amplification of the sense amplification module, thereby improving the speed and accuracy of memory data readout.

Referring to FIG. 5, the first readout circuit structure 301 is coupled to one of the adjacent memory arrays through a first bit line BL1, and coupled to the other one of the adjacent memory arrays through a first complementary bit line BLB1. The second readout circuit structure 302 is coupled to one of the adjacent memory arrays through a second bit line BL2, and coupled to the other one of the adjacent memory arrays through a second complementary bit line BLB2. The second isolation module, the sense amplification module, and the offset cancellation module of the first readout circuit structure 301 are arranged in a first region. In an extension direction of the bit line BL, the first isolation module in the first readout circuit structure 301 is arranged at two sides of the first region. The second isolation module, the sense amplification module, and the offset cancellation module in the second readout circuit structure 302 are arranged in a second region. In the extension direction of the bit line BL, the first isolation module in the second readout circuit structure 302 is arranged at two sides of the second region, where the first region and the second region are adjacent to each other in the bit line extension direction.

The first and second readout circuit structures are arranged adjacent to each other, and various parts are distributed orderly, thereby ensuring a minimized area occupied by the readout circuit structures and shortest connections among various devices.

In some embodiments, the first isolation module 201 includes a third isolation MOS transistor <23> and a fourth isolation MOS transistor <24>. One of a source and a drain of the third isolation MOS transistor <23> is connected to the first readout bit line SABL, the other of the source and the drain of the third isolation MOS transistor <23> is connected to the bit line BL, and a gate of the third isolation MOS transistor <23> is configured to receive the first isolation signal ISO1. One of a source and a drain of the fourth isolation MOS transistor <24> is connected to the first complementary readout bit line SABLB, the other of the source and the drain of the fourth isolation MOS transistor <24> is connected to the complementary bit line BLB, and a gate of the fourth isolation MOS transistor <24> is configured to receive the first isolation signal ISO1.

It should be noted that, for the third isolation MOS transistor <23> and the fourth isolation MOS transistor <24>, the specific connection manner of the "source" and "drain" of each transistor above does not limit this embodiment. In other embodiments, a connection manner in which the "source" is replaced with the "drain", and the "drain" is replaced with the "source" may be used.

In addition, this embodiment does not limit the types of the third isolation MOS transistor <23> and the fourth isolation MOS transistor <24>. In specific applications, the third isolation MOS transistor <23> and the fourth isolation MOS transistor <24> may be NMOS transistors or PMOS transistors.

Referring to FIG. 5 to FIG. 7, the first isolation module includes a third isolation MOS transistor <23> and a fourth isolation MOS transistor <24>.

The third isolation MOS transistor <23> of the first readout circuit structure 301 is connected to the first bit line BL1 and the first readout bit line (not shown in the figure) of the first readout circuit structure 301 through a contact plug. The fourth isolation MOS transistor <24> of the first readout circuit structure 301 is connected to the first complementary bit line BLB1 and the first complementary readout bit line (not shown in the figure) of the first readout circuit structure 301 through a contact plug. The third isolation MOS transistor <23> of the second readout circuit structure 302 is connected to the second bit line BL2 and the first readout bit line (not shown in the figure) of the second readout circuit structure 302 through a contact plug. The fourth isolation MOS transistor <24> of the second readout circuit structure 302 is connected to the second complementary bit line BLB2 and the first complementary readout bit line (not shown in the figure) of the second readout circuit structure 302 through a contact plug.

In an example, referring to FIG. 5, in the extension direction of the bit line BL, the third isolation MOS transistor <23> of the first readout circuit structure 301 is arranged at a side of the first region that is away from the second region. In the extension direction of the word line WL, the third isolation MOS transistor <23> of the second readout circuit structure 302 is adjacent to the third isolation MOS transistor <23> of the first readout circuit structure 301. In the extension direction of the bit line BL, the fourth isolation MOS transistor <24> of the second readout circuit structure 302 is arranged at a side of the second region that is away from the first region. In the extension direction of the word line WL, the fourth isolation MOS transistor <24> of the first readout circuit structure 301 is adjacent to the fourth isolation MOS transistor <24> of the second readout circuit structure 302.

In an example, referring to FIG. 6 and FIG. 7, in the extension direction of the bit line BL, the third isolation MOS transistor <23> of the first readout circuit structure 301 is arranged at a side of the first region that is away from the second region. In the extension direction of the bit line BL, the fourth isolation MOS transistor <24> of the first readout circuit structure 301 is arranged at a side of the first region that is close to the second region. In the extension direction of the bit line BL, the third isolation MOS transistor <23> of the second readout circuit structure 302 is arranged at a side of the second region that is away from the first region. In the extension direction of the bit line BL, the fourth isolation MOS transistor <24> of the second readout circuit structure 302 is arranged at a side of the second region that is close to the first region.

In a specific example, referring to FIG. 6, the fourth isolation MOS transistor <24> of the first readout circuit structure 301 is arranged close to the first region, and the third isolation MOS transistor <23> of the second readout circuit structure is arranged close to the second region.

In a specific example, referring to FIG. 7, the fourth isolation MOS transistor <24> of the first readout circuit structure 301 is arranged close to the second region, and the third isolation MOS transistor <23> of the second readout circuit structure is arranged close to the first region.

In some embodiments, the second isolation module 202 includes a first isolation MOS transistor <21> and a second isolation MOS transistor <22>. One of a source and a drain of the first isolation MOS transistor <21> is connected to the first readout bit line SABL, the other of the source and the drain of the first isolation MOS transistor <21> is connected to the second readout bit line ISABL, and a gate of the first isolation MOS transistor <21> is configured to receive the second isolation signal ISO2. One of a source and a drain of the second isolation MOS transistor <22> is connected to the first complementary readout bit line SABLB, the other of the source and the drain of the second isolation MOS transistor <22> is connected to the second complementary readout bit line ISABLB, and a gate of the second isolation MOS transistor <22> is configured to receive the second isolation signal ISO2.

It should be noted that, for the first isolation MOS transistor <21> and the second isolation MOS transistor <22>, the specific connection manner of the "source" and "drain" of each transistor above does not limit this embodiment. In other embodiments, a connection manner in which the "source" is replaced with the "drain", and the "drain" is replaced with the "source" may be used.

In addition, this embodiment does not limit the types of the first isolation MOS transistor <21> and the second isolation MOS transistor <22>. In specific applications, the first isolation MOS transistor <21> and the second isolation MOS transistor <22> may also be PMOS transistors.

In some embodiments, the sense amplification module includes: a first sense amplification N-type transistor <N1>, including a gate connected to the first readout bit line SABL, one of a source and a drain connected to the second complementary readout bit line ISABLB, and the other of the source and the drain connected to a second signal terminal NCS that is configured to provide a second voltage; a second sense amplification N-type transistor <N2>, including a gate connected to the first complementary readout bit line SABLB, one of a source and a drain connected to the second readout bit line ISABL, and the other of the source and the drain connected to the second signal terminal NCS; a first sense amplification P-type transistor <P1>, including a gate connected to the second readout bit line ISABL, one of a source and a drain connected to the second complementary readout bit line ISABLB, and the other of the source and the drain connected to a first signal terminal PCS that is configured to provide a first voltage, wherein the first voltage is greater than the second voltage; and a second sense amplification P-type transistor <P2>, including a gate connected to the second complementary readout bit line ISABLB, one of a source and a drain connected to the second readout bit line ISABL, and the other of the source and the drain connected to the first signal terminal PCS.

For the first readout circuit structure 301 and the second readout circuit structure 302, the precharge module includes a first precharge MOS transistor and a second precharge MOS transistor; the equalizing module includes an equalizing MOS transistor; the second isolation module includes a first isolation MOS transistor and a second isolation MOS transistor; and the offset cancellation module includes a first offset cancellation MOS transistor and a second offset cancellation MOS transistor.

In the extension direction of the bit line BL and in a part of the first region close to the second region, the first precharge MOS transistor, the first sense amplification N-type transistor, the first offset cancellation MOS transistor, the first isolation MOS transistor, the second sense amplification P-type transistor, the first sense amplification P-type transistor, the second isolation MOS transistor, the second offset cancellation MOS transistor, and the second precharge MOS transistor of the first readout circuit structure 301 are arranged sequentially.

In the extension direction of the bit line BL and in a part of the second region close to the first region, the first precharge MOS transistor, the first sense amplification N-type transistor, the first offset cancellation MOS transistor, the first isolation MOS transistor, the second sense amplification P-type transistor, the first sense amplification P-type transistor, the second isolation MOS transistor, the second offset cancellation MOS transistor, and the second precharge MOS transistor of the second readout circuit structure 302 are arranged sequentially.

For the first sense amplification structure 301, referring to FIG. 8 for the circuit diagram of the first region, the third isolation MOS transistor is <N1408>, the fourth isolation MOS transistor is <N1428> (referring to FIG. 9), the precharge MOS transistor is <N1406>, the first sense amplification N-type transistor is <N1400>, the first offset cancellation MOS transistor is <N1401>, the first isolation MOS transistor is <N1402>, the second sense amplification P-type transistor is <P1400>, the first sense amplification P-type transistor is <P1401>, the second isolation MOS transistor is <N1403>, and the second offset cancellation MOS transistor is <N1404>.

For the second sense amplification structure 302, referring to FIG. 9 for the circuit diagram of the second region, the third isolation MOS transistor is <N1409> (referring to FIG. 8), the fourth isolation MOS transistor is <N1429>, the precharge MOS transistor is <N1427>, the first sense amplification N-type transistor is <N1420>, the first offset cancellation MOS transistor is <N1421>, the first isolation MOS transistor is <N1422>, the second sense amplification P-type transistor is <P1420>, the first sense amplification P-type transistor is <P1421>, the second isolation MOS transistor is <N1423>, and the second offset cancellation MOS transistor is <N1424>.

For the sense amplification circuit connected to the bit line BL3 and the BL4 and connected to the complementary bit line BLB3 and the BLB4, i.e., the sense amplification circuit adjacent to the first sense amplification structure 301 and the second sense amplification structure 302 in the extension direction of the word line WL, details are not described in this embodiment.

It should be noted that, for the first sense amplification structure 301, one precharge MOS transistor in this figure is taken as an example for description. In other embodiments, a precharge MOS transistor for precharging the complementary bit line BLB may be added in FIG. 9. Similarly, for the second sense amplification structure 302, a precharge MOS transistor for precharging the bit line BL may be added in FIG. 8. The precharge configuration close to the bit line or the complementary bit line minimizes the voltage transmission loss and reduces a precharge time.

The left part in FIG. 10 corresponds to the layout of FIG. 8, and the right part in FIG. 10 corresponds to the layout of FIG. 9, where the slash-line region is a layout of an active layer, the blank frame region is a layout of a gate layer, and the shadow region is a layout of a contact layer. In this figure, the solid-line arrow pass through the layout of the contact layer, indicating that the structure represented by the solid-line arrow is in contact with the contact layer; regions through which the dashed-line arrow passes are not in contact with each other. In this layout design, the first readout circuit structure and the second readout circuit structure can be arranged in the same region, and the transistors are arranged orderly to minimize the occupied area, so that multiple transistors can be manufactured by using the same process, thus reducing the process manufacturing cost.

In this embodiment, the first voltage is greater than the second voltage, that is, the first voltage is a high level corresponding to logic "1", and the second voltage is a low level corresponding to logic "0"; in other embodiments, alternatively, the first voltage may be less than the second voltage, that is, the first voltage is a low level corresponding to logic "0", and the second voltage is a high level corresponding to logic "1".

With reference to FIG. 2, for the readout circuit provided by this embodiment, in phase S1, i.e., a precharge phase, the readout circuit is precharged, so as to precharge potentials of all lines in the readout circuit to a preset voltage. It should be noted that, in some embodiments, the second isolation signal ISO2 may also be a high level in phase S1.

Phase S2 includes three parts: an S2 pre-phase, an S2 mid-phase, and an S2 post-phase.

In the S2 pre-phase, the word line WL is turned on, a potential of storage data is transmitted from the memory cell to the bit line BL or the complementary bit line BLB. In this phase, the first isolation signal ISO1 is not received, the first readout bit line SABL is isolated from the bit line BL, and the first complementary readout bit line SABLB is isolated from the complementary bit line BLB. In this case, potentials on the bit line BL and the complementary bit line BLB cannot be synchronized to the sense amplification module. In addition, in the S2 pre-phase, the first voltage is provided to the first signal terminal PCS of the sense amplification module, the second voltage is provided to the second signal terminal NCS, and the offset canceling signal OC is provided continuously. An offset voltage difference formed by an amplified difference between the first sense amplification N-type transistor <N1> and the second sense amplification N-type transistor <N2> and an amplified difference between the first sense amplification P-type transistor <P1> and the second sense amplification P-type transistor <P2> is transferred to the second readout bit line ISABL and the second complementary readout bit line ISABLB. Potentials of the second readout bit line ISABL and the second complementary readout bit line ISABLB are set to have the offset voltage difference. Meanwhile, due to the presence of the offset canceling signal OC, the first offset cancellation MOS transistor <31> and the second offset cancellation MOS transistor <32> are turned on, the second readout bit line ISABL is connected to the first readout bit line SABL, the second complementary readout bit line ISABLB is connected to the first complementary readout bit line SABLB, and potentials of the first readout bit line SABL and the first complementary readout bit line SABLB are also set to have the offset voltage difference. Therefore, the offset noise of the sense amplification module is canceled.

In the S2 mid-phase, the signals received by the first signal terminal PCS and the second signal terminal NCS are restored to the preset voltage.

In the S2 post-phase, the first isolation signal ISO1 and the second isolation signal ISO2 are provided. The bit line BL and the first readout bit line SABL are electrically connected; the complementary bit line BLB and the first complementary readout bit line SABLB are electrically connected; the bit line BL and the first readout bit line SABL perform charge sharing, or the complementary bit line BLB and the first complementary readout bit line SABLB are electrically connected to perform charge sharing, so that the potential of the turned-on memory cell is synchronized to the first readout bit line SABL or the first complementary readout bit line SABLB through the word line WL, and the potential of the first readout bit line SABL or the first complementary readout bit line SABLB after synchronization has an offset voltage difference to implement the cross synchronization of the offset potential (in the offset cancellation process, the offset voltage on the second readout bit line ISABL is synchronized to the first complementary readout bit line SABLB, and will be synchronized to the first readout bit line SABL in this phase), so as to compensate for the amplified difference between the first sense amplification N-type transistor <N1> and the second sense amplification N-type transistor <N2> and compensate for the amplified difference between the first sense amplification P-type transistor <P1> and the second sense amplification P-type transistor <P2>.

In phase S3, i.e., a signal readout phase, the sense amplification module performs sense amplification according to the potentials of the first readout bit line SABL and the first complementary readout bit line SABLB, then reads out the storage data, and performs data restoration on the memory cell.

In phase S4, i.e., a signal reset phase, the potential of each line in the readout circuit is precharged to the preset voltage, to prepare for the next data readout.

Using an example in which data stored by the memory cell connected to the bit line BL is "0", a signal potential change process in the readout circuit is illustrated with reference to FIG. 2.

In phase S1, the readout circuit is precharged, and the first isolation signal ISO1, the offset canceling signal OC, and an external preset voltage VBLP are provided; potentials of the bit line BL, the first readout bit line SABL, the second readout bit line SABLB, the bit line BL, the first readout bit line SABL, the second readout bit line SABLB are precharged to the preset voltage VBLP.

In the S2 pre-phase, the word line WL is turned on, and the memory cell performs charge sharing with the bit line BL. Because the stored data is 0, the potential of the bit line BL is lower than the preset voltage VBLP after the charge sharing. Meanwhile, the offset canceling signal OC is held. The sense amplification module performs the offset cancellation process. After the offset voltage difference is transferred, assuming that the potential of the second complementary readout bit line ISABLB is lower than that of the second readout bit line ISABL, the potential of the first readout bit line SABL is lower than that of the first complementary readout bit line SABLB.

In the S2 post-phase, the first isolation signal ISO1 and the second isolation signal ISO2 are provided. The bit line BL performs charge sharing with the first readout bit line SABL, so that the potential of the first readout bit line SABLB is further reduced while the potential of the bit line BL rises and is partially recovered. After the complementary bit line BL is connected to the first complementary readout bit line SABLB, the potential remains unchanged.

In phase S3, the sense amplification module performs sense amplification according to the potentials of the first readout bit line SABL and the first complementary readout bit line SABLB, then reads out the storage data, and restores the potential in the memory cell.

For the precharge of the readout circuit, in some embodiments, referring to FIG. 3, the readout circuit further includes: a precharge module 320 and an equalizing module 310. The precharge module 320 is configured to precharge the bit line BL, the first readout bit line ISABL, the second readout bit line ISABL, the complementary bit line BLB, the first complementary readout bit line ISBALB, and the second complementary readout bit line ISABLB to the preset voltage according to a precharge signal PRE. The equalizing module 310 is configured to maintain the voltage of the second readout bit line ISABL consistent with that of the second complementary readout bit line ISABLB according to the equalizing signal EQ.

The precharge module 320 includes a precharge MOS transistor <12>, and the equalizing module 310 includes an equalizing MOS transistor <11>. A gate of the precharge MOS transistor <12> is configured to receive the precharge signal PRE, and one of a source and a drain of the precharge MOS transistor <12> is connected to the second readout bit line ISABL or the second complementary readout bit line ISABLB; the equalizing MOS transistor <11> is configured to receive the equalizing signal EQ, one of a source and a drain of the equalizing MOS transistor <11> is connected to the second readout bit line ISABL, and the other of the source and the drain of the equalizing MOS transistor <11> is connected to the second complementary readout bit line ISABLB.

It should be noted that, for the equalizing MOS transistor <11> and the precharge MOS transistor <12>, the specific connection manner of the "source" and "drain" of each transistor above does not limit this embodiment. In other embodiments, a connection manner in which the "source" is replaced with the "drain", and the "drain" is replaced with the "source" may be used.

In addition, this embodiment does not limit the types of the equalizing MOS transistor <11> and the precharge MOS transistor <12>. In specific applications, the equalizing MOS transistor <11> and the precharge MOS transistor <12> may be NMOS transistors, or PMOS transistors.

In some embodiments, referring to FIG. 4, the readout circuit further includes a first precharge module 401 and a second precharge module 402. The first precharge module 401 is connected to the bit line BL or the first readout bit line SABL and configured to precharge the bit line BL, the first readout bit line SABL, and the second readout bit line ISABL to the preset voltage according to the precharge signal PRE. The second precharge module 402 is connected to the complementary bit line BLB or the first complementary readout bit line SABLB and is configured to precharge the complementary bit line BLB, the first complementary readout bit line SABLB, and the second complementary readout bit line ISABLB to the preset voltage according to the precharge signal PRE.

The first precharge module 401 includes a first precharge MOS transistor <41>, and the second precharge module includes a second precharge MOS transistor <42>. A gate of the first precharge MOS transistor <41> is configured to receive the precharge signal PRE, one of a source and a drain of the first precharge MOS transistor <41> is connected to the bit line BL or the first readout bit line SABL, and the other of the source and the drain of the first precharge MOS transistor <41> is configured to receive the preset voltage. A gate of the second precharge MOS transistor <42> is configured to receive the precharge signal PRE, one of a source and a drain of the second precharge MOS transistor <42> is connected to the complementary bit line BLB or the first complementary readout bit line SABLB, and the other of the source and the drain of the second precharge MOS transistor <42> is configured to receive the preset voltage.

It should be noted that, for the first precharge MOS transistor <41> and the second precharge MOS transistor <42>, the specific connection manner of the "source" and "drain" of each transistor above does not limit this embodiment. In other embodiments, a connection manner in which the "source" is replaced with the "drain", and the "drain" is replaced with the "source" may be used.

In addition, this embodiment does not limit the types of the first precharge MOS transistor <41> and the second precharge MOS transistor <42>. In specific applications, the first precharge MOS transistor <41> and the second precharge MOS transistor <42> may be NMOS transistors or PMOS transistors.

It should be noted that, the "preset voltage" mentioned above is a voltage required for precharging a memory in a precharge phase, and a specific voltage value is set according to a precharge voltage required for normal operation of the memory. In this embodiment, the preset voltage VBLP=½VDD, where VDD is a power voltage inside a chip. In some embodiments, the preset voltage VBLP may be set according to specific application scenarios.

Further referring to FIG. 1, in this embodiment, the offset cancellation module 203 includes a first offset cancellation MOS transistor <31> and a second offset cancellation MOS transistor <32>. A gate of the first offset cancellation MOS transistor <31> is configured to receive the offset canceling signal OC, one of a source and a drain of the first offset cancellation MOS transistor <31> is connected to the second complementary readout bit line ISABLB, and the other of the source and the drain of the first offset cancellation MOS transistor <31> is connected to the first readout bit line SABL. A gate of the second offset cancellation MOS transistor <32> is configured to receive the offset canceling signal OC, one of a source and a drain of the second offset cancellation MOS transistor <32> is connected to the second readout bit line ISABL, and the other of the source and the drain of the second offset cancellation MOS transistor <32> is connected to the first complementary readout bit line SABLB.

It should be noted that, for the first offset cancellation MOS transistor <31> and the second offset cancellation MOS transistor <32>, the specific connection manner of the "source" and "drain" of each transistor above does not limit this embodiment. In other embodiments, a connection manner in which the "source" is replaced with the "drain", and the "drain" is replaced with the "source" may be used.

In addition, this embodiment does not limit the types of the first offset cancellation MOS transistor <31> and the second offset cancellation MOS transistor <32>. In specific applications, the first offset cancellation MOS transistor <31> and the second offset cancellation MOS transistor <32> may be NMOS transistors or PMOS transistors.

The first isolation module 201 isolates the bit line BL from the first readout bit line SABL, and blocks the complementary bit line BLB and the first complementary readout bit line SABLB, which prevents potential changes of the bit line BL and the complementary bit line BLB from affecting the sense amplification module, thereby turning on the word line WL in advance without affecting the sense amplification module. By turning on the word line WL in advance, the potential on the memory cell 100 is synchronized to an initial bit line BL or initial complementary bit line BLB, so that there is sufficient time for potential amplification of the sense amplification module, thereby improving the speed and accuracy of memory data readout.

It should be noted that, in order to highlight the innovative part of the present disclosure, units that are not closely related to resolving the technical problem proposed by the present disclosure are not introduced in this embodiment, but this does not indicate that there are no other units in this embodiment. Those skilled in the art can understand that the above embodiments are specific embodiments for implementing the present disclosure. In practical applications, various changes may be made to the above embodiments in terms of forms and details without departing from the spirit and scope of the present disclosure.

Another embodiment of the present disclosure provides a method of reading data, which is applied to the readout circuit layout structure provided by the foregoing embodiment. The method of reading data provided by this embodiment is described in further detail below with reference to the accompanying drawings.

Referring to FIG. 2, the method of reading data has three readout phases, including a first readout phase S1, a second readout phase S2, and a third readout phase S3.

In the first readout phase S1, an equalizing signal (EQ), a first isolation signal (Isolation Signal 1, ISO1), and an offset canceling signal (OC) are provided, and a bit line BL, a first readout bit line ISABL, a second readout bit line SABL, a complementary bit line BLB, a first complementary readout bit line ISABLB, and a second complementary readout bit line SABLB are precharged to a preset voltage.

The equalizing signal EQ is provided to electrically connect the second readout bit line ISABL and the second complementary readout bit line ISABLB. The first isolation signal ISO1 electrically connects the bit line BL and the first readout bit line SABL, and electrically connects the complementary bit line BLB and the first complementary readout bit line SABLB. The offset canceling signal OC is provided to electrically connect the second readout bit line ISABL and the first complementary readout bit line SABLB, and electrically connect the second complementary readout bit line ISABLB and the first readout bit line SABL. Then, a precharge signal (PRE) is provided, to precharge the bit line BL, the first readout bit line ISABL, the second readout bit line SABL, the complementary bit line BLB, the first complementary readout bit line ISABLB, and the second complementary readout bit line SABLB to the preset voltage.

It should be noted that, in some embodiments, the second isolation signal ISO2 may also be a high level in the first readout phase S1. In addition, in this embodiment, the preset voltage VBLP=½VDD, where VDD is a power voltage inside a chip. In other embodiments, the preset voltage VBLP may be set according to specific application scenarios.

At the beginning of the second readout phase, the offset canceling signal is held for a preset duration; offset cancellation is performed on a sense amplification module through a first voltage and a second voltage applied to two ends of the sense amplification module; a word line of a memory array is turned on at the same time, and charge sharing is performed based on a potential of the bit line and a potential of a memory cell in the memory array.

In an execution process of the second readout phase, the first isolation signal ISO1 and the second isolation signal ISO2 are provided, storage data is transmitted from the bit line BL to the first readout bit line SABL, the complementary bit line BL is maintained at the preset voltage, and charge sharing is performed on a potential of the first readout bit line SABL and a potential of the second readout bit line ISABL.

It should be noted that, in some embodiments, the storage data may also be transmitted from the complementary bit line BLB to the first complementary readout bit line SABLB, the bit line BL is maintained at the preset voltage, and charge sharing is performed on a potential of the first complementary readout bit line SABLB and a potential of the second complementary readout bit line ISABLB. In addition, in some embodiments, the storage data may be transmitted through the bit line BL and the complementary bit line BLB at the same time.

In the third readout phase S3, the first isolation signal ISO1 and the second isolation signal ISO2 are maintained. Through the first voltage and the second voltage applied to two ends of the sense amplification module, the sense amplification module perform sense amplification on the storage data according to the potentials of the second readout bit line ISABL and the second complementary readout bit line ISABLB, reads out the storage data, and restores the storage data in the memory cell.

The second readout phase includes a first sub-phase, a second sub-phase, and a third sub-phase that are performed in sequence.

In the first sub-phase, the first voltage and the second voltage are applied to two ends of the sense amplification module, and a read command and the offset canceling signal are provided.

In the first sub-phase, i.e., the S2 pre-phase, the word line WL is turned on based on the read command of the memory, and is configured to synchronize the potential of the memory cell to the bit line BL or the complementary bit line BLB. In addition, in the S2 pre-phase, the first voltage is provided to the first signal terminal PCS of the sense amplification module, the second voltage is provided to the second signal terminal NCS, and the offset canceling signal OC is provided continuously. An offset voltage difference formed by an amplified difference between the first sense amplification N-type transistor <N1> and the second sense amplification N-type transistor <N2> and an amplified difference between the first sense amplification P-type transistor <P1> and the second sense amplification P-type transistor <P2> is transferred to the second readout bit line ISABL and the second complementary readout bit line ISABLB. Potentials of the second readout bit line ISABL and the second complementary readout bit line ISABLB are set to have the offset voltage difference. Meanwhile, due to the presence of the offset canceling signal OC, the first offset cancellation MOS transistor <31> and the second offset cancellation MOS transistor <32> are turned on, the second readout bit line ISABL is connected to the first readout bit line SABL, the second complementary readout bit line ISABLB is connected to the first complementary readout bit line SABLB, and potentials of the first readout bit line SABL and the first complementary readout bit line SABLB are also set to have the offset voltage difference. Therefore, the offset noise of the sense amplification module is canceled.

In the second sub-phase, the first voltage and the second voltage are restored to the preset voltage.

In the third sub-phase, the first isolation signal ISO1 and the second isolation signal ISO2 are provided.

In the third sub-phase, i.e., the S2 post-phase, the first isolation signal ISO1 and the second isolation signal ISO2 are provided. The bit line BL and the first readout bit line SABL are electrically connected; the complementary bit line BLB and the first complementary readout bit line SABLB are electrically connected; the bit line BL and the first readout bit line SABL perform charge sharing, or the complementary bit line BLB and the first complementary readout bit line SABLB are electrically connected to perform charge sharing, so that the potential of the turned-on memory cell is synchronized to the first readout bit line SABL or the first complementary readout bit line SABLB through the word line WL, and the potential of the first readout bit line SABL or the first complementary readout bit line SABLB after synchronization has an offset voltage difference to implement the cross synchronization of the offset potential (in the offset cancellation process, the offset voltage on the second readout bit line ISABL is synchronized to the first complementary readout bit line SABLB, and will be synchronized to the first readout bit line SABL in this phase), so as to compensate for the amplified difference between the first sense amplification N-type transistor <N1> and the second sense amplification N-type transistor <N2> and compensate for the amplified difference between the first sense amplification P-type transistor <P1> and the second sense amplification P-type transistor <P2>.

It should be noted that, referring to FIG. 2, in some embodiments, the second sub-phase further includes: providing the equalizing signal, to balance a voltage difference between the second readout bit line ISABL and the second complementary readout bit line ISABLB.

The bit line BL and the first readout bit line SABL are isolated from each other, and the complementary bit line BLB and the first complementary readout bit line SABLB are blocked, which prevents potential changes of the bit line BL and the complementary bit line BLB from affecting the sense amplification module, thereby turning on the word line WL in advance without affecting the sense amplification module. By turning on the word line WL in advance, the potential on the memory cell 100 is synchronized to an initial bit line BL or initial complementary bit line BLB, so that there is sufficient time for potential amplification of the sense amplification module, thereby improving the speed and accuracy of memory data readout.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

Embodiments of the present disclosure provide a readout circuit layout structure and a method of reading data. A new readout circuit is providing, which ensures that there is sufficient time for potential amplification of a sense amplification module, thereby improving the speed and accuracy of memory data readout; moreover, first and second readout circuit structures are arranged adjacent to each other, and various parts are distributed orderly, thereby ensuring a minimized area occupied by the readout circuit structures and shortest connections among various devices.

The invention claimed is:

1. A readout circuit layout structure, comprising:
a first readout circuit structure and a second readout circuit structure having identical structures, wherein the first readout circuit structure and the second readout circuit structure each comprise:
a first isolation module, configured to be turned on according to a first isolation signal, electrically connect a bit line and a first readout bit line, and electrically connect a complementary bit line and a first complementary readout bit line;
a second isolation module, configured to be turned on according to a second isolation signal, electrically connect the first readout bit line and a second readout bit line, and electrically connect the first complementary readout bit line and a second complementary readout bit line;
a sense amplification module, configured to sense and read a data signal of a memory array when the first isolation module and the second isolation module are turned on; and
an offset cancellation module, configured to electrically connect the first complementary readout bit line and the second readout bit line according to an offset canceling signal;
wherein the first readout circuit structure is coupled to first adjacent memory arrays through a first bit line and a first complementary bit line; and the second readout circuit structure is coupled to second adjacent memory arrays through a second bit line and a second complementary bit line;
the second isolation module, the sense amplification module, and the offset cancellation module in the first readout circuit structure are arranged in a first region; in a bit line extension direction, the first isolation module in the first readout circuit structure is arranged at two sides of the first region; the second isolation module, the sense amplification module, and the offset cancellation module in the second readout circuit structure are arranged in a second region; in the bit line extension direction, the first isolation module in the second readout circuit structure is arranged at two sides of the second region; and
the first region and the second region are adjacent to each other in the bit line extension direction.

2. The readout circuit layout structure according to claim 1, wherein the second isolation module comprises a first isolation metal oxide semiconductor (MOS) transistor and a second isolation MOS transistor;
one of a source and a drain of the first isolation MOS transistor is connected to the first readout bit line, the other of the source and the drain of the first isolation MOS transistor is connected to the second readout bit line, and a gate of the first isolation MOS transistor is configured to receive the second isolation signal; and
one of a source and a drain of the second isolation MOS transistor is connected to the first complementary readout bit line, the other of the source and the drain of the second isolation MOS transistor is connected to the second complementary readout bit line, and a gate of the second isolation MOS transistor is configured to receive the second isolation signal.

3. The readout circuit layout structure according to claim 1, wherein the first isolation module comprises a third isolation metal oxide semiconductor (MOS) transistor and a fourth isolation MOS transistor;
one of a source and a drain of the third isolation MOS transistor is connected to the first readout bit line, the other of the source and the drain of the third isolation MOS transistor is connected to the bit line, and a gate of the third isolation MOS transistor is configured to receive the first isolation signal; and
one of a source and a drain of the fourth isolation MOS transistor is connected to the first complementary readout bit line, the other of the source and the drain of the fourth isolation MOS transistor is connected to the complementary bit line, and a gate of the fourth isolation MOS transistor is configured to receive the first isolation signal.

4. The readout circuit layout structure according to claim 1, wherein the sense amplification module comprises:
a first sense amplification N-type transistor, comprising a gate connected to the first readout bit line, one of a source and a drain connected to the second complementary readout bit line, and the other of the source and the drain connected to a second signal terminal that is configured to provide a second voltage;
a second sense amplification N-type transistor, comprising a gate connected to the first complementary readout bit line, one of a source and a drain connected to the second readout bit line, and the other of the source and the drain connected to the second signal terminal;
a first sense amplification P-type transistor, comprising a gate connected to the second readout bit line, one of a source and a drain connected to the second complementary readout bit line, and the other of the source and the drain connected to a first signal terminal that is configured to provide a first voltage, wherein the first voltage is greater than the second voltage; and
a second sense amplification P-type transistor, comprising a gate connected to the second complementary readout bit line, one of a source and a drain connected to the second readout bit line, and the other of the source and the drain connected to the first signal terminal.

5. The readout circuit layout structure according to claim 1, further comprising:
a precharge module, configured to precharge the bit line, the first readout bit line, the second readout bit line, the complementary bit line, the first complementary readout bit line, and the second complementary readout bit line to a preset voltage according to a precharge signal; and an equalizing module, configured to maintain a voltage of the second readout bit line consistent with a voltage of the second complementary readout bit line according to an equalizing signal.

6. The readout circuit layout structure according to claim 5, wherein the precharge module comprises a precharge metal oxide semiconductor (MOS) transistor, and the equalizing module comprises an equalizing MOS transistor;
- a gate of the precharge MOS transistor is configured to receive the precharge signal, one of a source and a drain of the precharge MOS transistor is connected to the second readout bit line or the second complementary readout bit line, and the other of the source and the drain of the precharge MOS transistor is configured to receive the preset voltage; and
- a gate of the equalizing MOS transistor is configured to receive the equalizing signal, one of a source and a drain of the equalizing MOS transistor is connected to the second readout bit line, and the other of the source and the drain of the equalizing MOS transistor is connected to the second complementary readout bit line.

7. The readout circuit layout structure according to claim 1, further comprising:
- a first precharge module, connected to the bit line or the first readout bit line, and configured to precharge the bit line, the first readout bit line, and the second readout bit line to a preset voltage according to a precharge signal; and
- a second precharge module, connected to the complementary bit line or the first complementary readout bit line, and configured to precharge the complementary bit line, the first complementary readout bit line, and the second complementary readout bit line to the preset voltage according to the precharge signal.

8. The readout circuit layout structure according to claim 7, wherein the first precharge module comprises a first precharge metal oxide semiconductor (MOS) transistor, and the second precharge module comprises a second precharge MOS transistor;
- a gate of the first precharge MOS transistor is configured to receive the precharge signal, one of a source and a drain of the first precharge MOS transistor is connected to the bit line or the first readout bit line, and the other of the source and the drain of the first precharge MOS transistor is configured to receive the preset voltage; and
- a gate of the second precharge MOS transistor is configured to receive the precharge signal, one of a source and a drain of the second precharge MOS transistor is connected to the complementary bit line or the first complementary readout bit line, and the other of the source and the drain of the second precharge MOS transistor is configured to receive the preset voltage.

9. The readout circuit layout structure according to claim 1, wherein the offset cancellation module comprises a first offset cancellation metal oxide semiconductor (MOS) transistor and a second offset cancellation MOS transistor;
- a gate of the first offset cancellation MOS transistor is configured to receive the offset canceling signal, one of a source and a drain of the first offset cancellation MOS transistor is connected to the second complementary readout bit line, and the other of the source and the drain of the first offset cancellation MOS transistor is connected to the first readout bit line; and
- a gate of the second offset cancellation MOS transistor is configured to receive the offset canceling signal, one of a source and a drain of the second offset cancellation MOS transistor is connected to the second readout bit line, and the other of the source and the drain of the second offset cancellation MOS transistor is connected to the first complementary readout bit line.

10. The readout circuit layout structure according to claim 3, wherein
- the third isolation MOS transistor of the first readout circuit structure is connected to the first bit line and the first readout bit line through a contact plug, and is configured to electrically connect the first bit line to the first readout bit line of the first readout circuit structure according to the first isolation signal;
- the fourth isolation MOS transistor of the first readout circuit structure is connected to the first complementary bit line and the first complementary readout bit line through a contact plug, and is configured to electrically connect the first complementary readout bit line of the first readout circuit structure to the first complementary bit line according to the first isolation signal;
- the third isolation MOS transistor of the second readout circuit structure is connected to the second bit line and the second readout bit line through a contact plug, and is configured to electrically connect the second bit line to the first readout bit line of the second readout circuit structure according to the first isolation signal; and
- the fourth isolation MOS transistor of the second readout circuit structure is connected to the second complementary bit line and the second complementary readout bit line through a contact plug, and is configured to electrically connect the first complementary readout bit line of the second readout circuit structure to the second complementary bit line according to the first isolation signal.

11. The readout circuit layout structure according to claim 10, wherein
- in the bit line extension direction, the third isolation MOS transistor of the first readout circuit structure is arranged at a side of the first region that is away from the second region;
- in a word line extension direction, the third isolation MOS transistor of the second readout circuit structure and the third isolation MOS transistor of the first readout circuit structure are adjacent to each other;
- in the bit line extension direction, the fourth isolation MOS transistor of the second readout circuit structure is arranged at a side of the second region that is away from the first region; and
- in the word line extension direction, the fourth isolation MOS transistor of the first readout circuit structure and the fourth isolation MOS transistor of the second readout circuit structure are adjacent to each other.

12. The readout circuit layout structure according to claim 10, wherein
- in the bit line extension direction, the third isolation MOS transistor of the first readout circuit structure is arranged at a side of the first region that is away from the second region;
- in the bit line extension direction, the fourth isolation MOS transistor of the first readout circuit structure is arranged at a side of the first region that is close to the second region;
- in the bit line extension direction, the third isolation MOS transistor of the second readout circuit structure is arranged at a side of the second region that is away from the first region; and in the bit line extension direction, the fourth isolation MOS transistor of the second readout circuit structure is arranged at a side of the second region that is close to the first region.

13. The readout circuit layout structure according to claim 12, wherein the fourth isolation MOS transistor of the first readout circuit structure is arranged close to the first region, and the third isolation MOS transistor of the second readout circuit structure is arranged close to the second region.

14. The readout circuit layout structure according to claim 12, wherein the fourth isolation MOS transistor of the first readout circuit structure is arranged close to the second region, and the third isolation MOS transistor of the second readout circuit structure is arranged close to the first region.

15. The readout circuit layout structure according to claim 4, wherein
a precharge module of the readout circuit layout structure comprises a first precharge metal oxide semiconductor (MOS) transistor and a second precharge MOS transistor;
the second isolation module comprises a first isolation MOS transistor and a second isolation MOS transistor;
an equalizing module of the readout circuit layout structure comprises an equalizing MOS transistor;
the offset cancellation module comprises a first offset cancellation MOS transistor and a second offset cancellation MOS transistor;
in the bit line extension direction and in a part of the first region close to the second region, the first precharge MOS transistor, the first sense amplification N-type transistor, the first offset cancellation MOS transistor, the first isolation MOS transistor, the second sense amplification P-type transistor, the first sense amplification P-type transistor, the second isolation MOS transistor, the second offset cancellation MOS transistor, and the second precharge MOS transistor of the first readout circuit structure are arranged sequentially; and
in the bit line extension direction and in a part of the second region close to the first region, the first precharge MOS transistor, the first sense amplification N-type transistor, the first offset cancellation MOS transistor, the first isolation MOS transistor, the second sense amplification P-type transistor, the first sense amplification P-type transistor, the second isolation MOS transistor, the second offset cancellation MOS transistor, and the second precharge MOS transistor of the second readout circuit structure are arranged sequentially.

16. A method of reading data, applied to the readout circuit layout structure according to claim 1 and comprising three readout phases, comprising:
in a first readout phase, providing an equalizing signal, a first isolation signal, and an offset canceling signal, and precharging a bit line, a first readout bit line, a second readout bit line, a complementary bit line, a first complementary readout bit line, and a second complementary readout bit line to a preset voltage;
at a beginning of a second readout phase, holding the offset canceling signal for a preset duration, performing an offset cancellation on a sense amplification module through a first voltage and a second voltage applied to two ends of the sense amplification module, turning on a word line of a memory array at the same time, and performing a charge sharing based on a potential of the bit line and a potential of a memory cell in the memory array;
in an execution process of the second readout phase, providing the first isolation signal and a second isolation signal, transmitting storage data from the bit line to the first readout bit line, maintaining the complementary bit line at the preset voltage, and performing a charge sharing on a potential of the first readout bit line and a potential of the second readout bit line; and
in a third readout phase, holding the first isolation signal and the second isolation signal, through the first voltage and the second voltage applied to the two ends of the sense amplification module, performing a sense amplification on the storage data by the sense amplification module according to the potential of the second readout bit line and a potential of the second complementary readout bit line, reading the storage data, and restoring the storage data in the memory cell.

17. The method of reading data according to claim 16, wherein the second readout phase comprises a first sub-phase, a second sub-phase, and a third sub-phase that are executed sequentially;
in the first sub-phase, the first voltage and the second voltage are applied to the two ends of the sense amplification module, and a read command and the offset canceling signal are provided;
in the second sub-phase, the first voltage and the second voltage are restored to the preset voltage; and
in the third sub-phase, the first isolation signal and the second isolation signal are provided.

18. The method of reading data according to claim 17, wherein the second sub-phase further comprises: providing the equalizing signal.

* * * * *

UNITED STATES PATENT AND TRADEMARK OFFICE
CERTIFICATE OF CORRECTION

PATENT NO. : 11,594,264 B1  
APPLICATION NO. : 17/813998  
DATED : February 28, 2023  
INVENTOR(S) : Sungsoo Chi Page 1 of 1

It is certified that error appears in the above-identified patent and that said Letters Patent is hereby corrected as shown below:

On the Title Page

Item (73) Assignee:  
Please delete "GHANGXIN MEMORY TECHNOLOGIES, INC." and replace with --CHANGXIN MEMORY TECHNOLOGIES, INC.--

Signed and Sealed this  
Fifteenth Day of August, 2023

Katherine Kelly Vidal  
*Director of the United States Patent and Trademark Office*